Jan. 19, 1965 C. W. MUELLER 3,166,694

SYMMETRICAL POWER TRANSISTOR

Original Filed Feb. 14, 1958 2 Sheets-Sheet 1

INVENTOR.
CHARLES W. MUELLER
BY J. C. Whittaker

INVENTOR.
CHARLES W. MUELLER
BY J. L. Whittaker 3,166,694

SYMMETRICAL POWER TRANSISTOR

Charles W. Mueller, Princeton, N.J., assignor to Radio Corporation of America, a corporation of Delaware Original application Feb. 14, 1958, Ser. No. 715,393, now Patent No. 2,967,344. Divided and this application Apr. 6, 1960, Ser. No. 20,313
5 Claims. (Cl. 317—235)

This application is a division of application Serial No. 715,393, filed February 14, 1958, now U.S. Patent 2,967,344.

This invention relates to semiconductor devices, and more particularly, to improved devices containing a broad-area rectifying barrier, and to methods of making such devices.

Broad-area semiconductor devices are distinguished from narrow or limited area devices which have point contact or line contact rectifying junctions. Devices which contain a broad-area rectifying barrier or PN junction may include grown junctions, diffused junctions, and surface alloyed or fused junctions. One of the most useful broad-area devices is the junction transistor, which comprises a body of monocrystalline semiconductive material including a zone or region of given conductivity type that separates two adjacent spaced regions of opposite conductivity type. In such units, one of the two spaced regions is generally denominated the emitter, while the other spaced region is known as the collector. The intermediate zone of given conductivity type is called the base region.

Thin base regions are desirable in junction transistors for two reasons. Transistor action depends on the injection of minority charge carriers from the emitter into the base region. The injected carriers travel by diffusion through the base region to the collector region. Since the diffusion of the injected minority carriers through the base is relatively slow, the transit time of the minority carriers through the base is one of the factors which limits the high frequency response of a transistor. Hence a thin base region is desirable to improve the electrical characteristics of the devices at high frequencies.

Thin base regions are also desirable since some of the minority carriers, during their transit through the base region, recombine with the majority carriers of the base. The thicker the base and the longer the transit time, the more minority carriers are thus lost by recombination. Thin base regions serve to reduce the fraction of the injected carriers lost by recombination, and hence improve the efficiency of the device.

Although thin base regions improve the efficiency and the high frequency response of junction transistors, they have certain disadvantages. For example, the electrical connections to thin base regions are difficult to fabricate, and tend to be fragile. More important, the resistance of the base zone of a semiconductor wafer increases as the thickness of the zone decreases. The high resistance of thin base zones limits the ability of the zone to conduct high currents. If the base region is made thicker to increase the power-handling capacity of the device, the efficiency and high frequency performance of the device is reduced. It has therefore been extremely difficult to design and fabricate efficient junction transistors which can handle sufficient power at high frequencies for such applications as the deflection circuits of television receivers.

An object of this invention is to provide an improved method of making improved semiconductor devices.

Another object of the invention is to provide an improved method of making broad-area junction transsistors.

Still another object of this invention is to provide improved high frequency transistors.

But another object of the invention is to provide improved symmetrical power transistors.

These and other objects are accomplished by forming a recess in one major face of a monocrystalline semiconductor wafer of given conductivity type, then diffusing an opposite conductivity type impurity into the entire wafer surface to form a surface layer over the wafer of said opposite conductivity type. The surface layer is next removed except for the portion in the recess and a portion on the other major face which is coaxially opposite the recess. The portion opposite the recess is thereby raised over the remainder of the other major wafer face. To complete the device, an emitter lead is ohmically connected to the bottom of the recess, a base tab is attached to the wafer face which contains the recess, and a collector lead is attached to the opposite type portion of the other major wafer face.

The invention will be described in greater detail by reference to the accompanying drawing, in which:

FIGURES 3A–3C illustrate successive steps in the fabrication of a device made in accordance with another embodiment of the instant invention, FIGURE 3A being a schematic view while FIGURES 3B and 3C are cross-sectional elevational views.

A preferred example of a method in accordance with the present invention will illustrate the preparation of a broad-area germanium junction triode of the NPN type. However, it is to be understood that the method is equally applicable in making PNP devices, and that other semiconductors such as silicon and silicon-germanium alloys may be utilized instead of germanium.

*Example I*

Figure 1A:
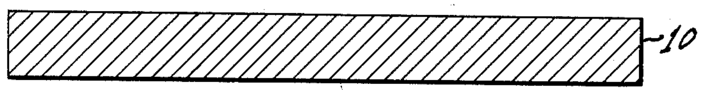
FIGURES 1A–1G are cross-sectional elevational views of successive steps in the fabrication of a device made in accordance with one embodiment of the present invention.

Referring to FIGURE 1A, a wafer of monocrystalline P-conductivity type germanium is prepared. The exact dimensions are not critical. In this example, the wafer is 250 mils square and 8 mils thick. The wafer 10 may contain any of the conventional acceptors for the particular semiconductor utilized. When the wafer consists of germanium or silicon or germanium-silicon alloys, acceptor impurity materials such as boron, aluminum, gallium or indium may be employed. In this example, the wafer 10 contains sufficient acceptor impurities to have a resistivity of about 4 to 6 ohm centimeters.

Figure 1B:
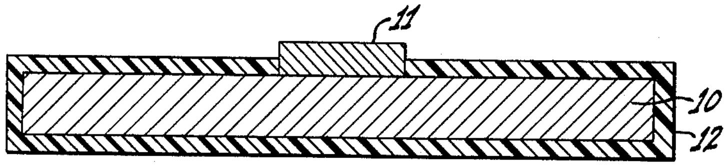

Referring to FIGURE 1B, a mask 11 is centered on one major face of the wafer 10. The material of the mask is not critical. The shape of the mask can be any desired configuration. The mask 11 may for example be a nickel disc about 130 mils in diameter. The wafer 10 is then sprayed with an acid-resistant lacquer such as nitrocellulose, so that the wafer 10 is covered with a coating 12 of the lacquer except for the portion of the wafer surface which was covered by the mask 11.

Figure 1C:
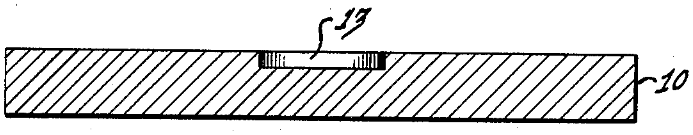

Referring to FIGURE 1C, the mask 11 is removed and the wafer 10 is etched with an acid etchant. Preferably a slow acting etchant is used. In this example, a suitable etchant has the composition 10 parts solution "A" to 1 part solution "B," where solution "A" is a mixture of 1 part concentrated hydrofluoric acid, 3 parts concentrated acetic acid, and 6 parts concentrated nitric acid, while solution "B" consists of .055 gram iodine dissolved in 100 cc. of water. The etchant will attack only that portion of the wafer surface which was previously covered by the nickel disc 11. A recess or well 13 is thus formed in the one major wafer face. The shape of the recess 13 corresponds to the shape of the mask 11. The depth of the well 13 is readily controlled by controlling the period of time that the wafer is immersed in the etchant. In this example, etching is continued until the germanium at the bottom of the well is 3.2 mils thick. The wafer is then removed, washed in deionized water to remove any remaining acid, and then washed in a solvent such as methanol or benzene to remove the lacquer coating 12.

Figure 1D:
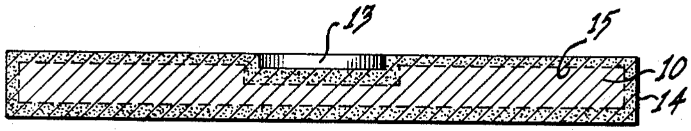

Referring to FIGURE 1D, a donor impurity, for example arsenic, is diffused into the water. The diffusion step may be performed, for example, by inserting the wafer in a quartz tube, evacuating the tube, then introducing vapors of a donor material such as phosphorus or arsenic. Other methods of accomplishing the diffusion step are described in my copending application No. 598,180, filed July 16, 1956, and my copending application No. 667,916, filed June 25, 1957. The wafer region 14 adjacent to the surface is thereby converted to N-conductivity type. The boundary 15 between the diffused N-type region 14 and the P-type bulk of the wafer 10 forms the site of a rectifying barrier or PN junction. Preferably a sufficient amount of donor material is diffused into the wafer 10 so as to make the surface layer 14 strongly N-type. In this example, sufficient arsenic was diffused into the wafer so that the concentration of arsenic atoms at the wafer surface was about $10^{20}$ per cubic centimeter.

Figure 1E:
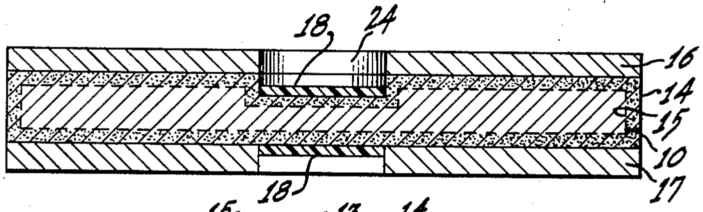

Referring to FIGURE 1E, a mask 16 containing a central aperture 24 is placed over the major wafer face which includes well 13. The aperture 24 in the mask 16 corresponds in size and shape to the well 13. A similar mask 17 is placed on the other major wafer face. A wax 18 is then sprayed over the unmasked portions of each major wafer face. Any acid-resistant wax may be utilized. In this example, Kel–F 200 wax was employed.

Figure 1F:
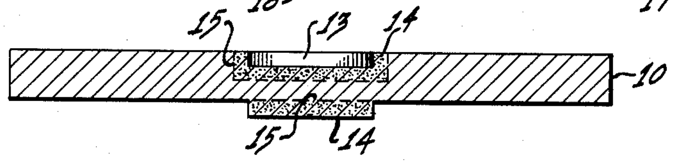

Referring to FIGURE 1F, the masks 16 and 17 are removed, and the unit is treated in an acid etchant so as to remove the N-type surface layer 14 except for the portion at the bottom of the recess 13 and the coaxially opposite portion, which were both covered by the wax 18. A suitable etchant has the composition previously described. The wafer is then washed in deionized water to remove all traces of the etchant, and is then immersed in an organic solvent such as methanol or benzene to remove the wax. As a result of this treatment the wafer now has an N-type layer 14 at the bottom of the recess 13, and a similar N-type layer 14 on a raised portion or boss on the opposite wafer surface coaxial with the recess 13.

Figure 1G:
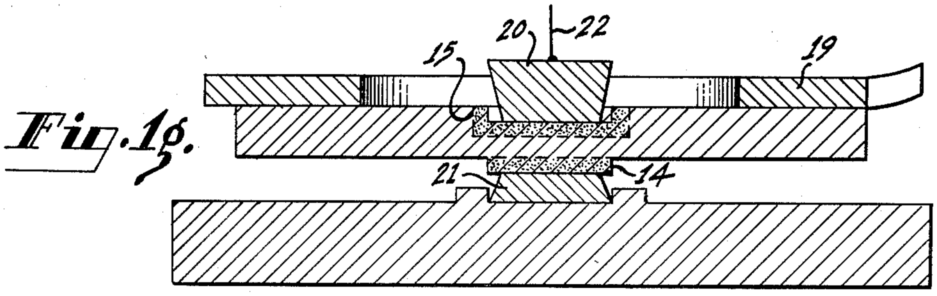

Referring to FIGURE 1G, a metal stud 20 of about 110 mils diameter is soldered to the bottom of the recess 13. A 99 lead–1 arsenic solder may be used for this purpose. A similar metal stud 21 is attached to the coaxially opposite N-type boss. The stud may for example be made of silver, or of an alloy of 99 lead–1 arsenic. The studs 20 and 21 serve to remove the heat dissipated during the operation of the device at high power levels. The stud 20 which was soldered to the bottom of the well 13 serves as the emitter connection. The stud 21 serves as the collector connection. Since most of the heat dissipated by a transistor is generated at the collector, it is advantageous to attach the stud 21 to a large block 23 of material such as oxygen-free high conductivity copper. The block 23 serves as a heat sink. A base tab 19, which may for example, be nickel, is soldered to the wafer face which contains the emitter stud 20. Advantageously, the tab 19 is annular or ring shaped, so as to fit around the well 13. The unit may then be cased by conventional methods.

Transistors thus made have a large planar emitter junction closely spaced to a large planar collector junction, and are electrically symmetrical. Hence transistors according to the invention can control high currents in either direction. Furthermore, the base region is thin enough between the junctions to give efficient performance at high frequencies, but is thick enough next to the base tab 19 to give a sturdy low-resistance contact.

A modification of the embodiment described in Example I will now be described.

*Example II*

Figure 2A:
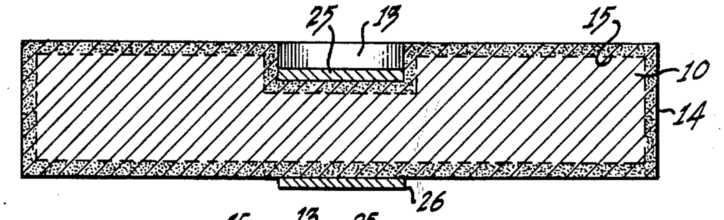
FIGURES 2A–2C are cross-sectional elevational views of successive steps in the fabrication of a device made in accordance with another embodiment of the present invention.

Referring to FIGURE 2A, a germanium wafer is prepared as described above in connection with FIGURES 1A to 1D. A metal plate 25 is soldered to the N-type layer 14 at the bottom of the recess 13. A similar metal plate 26 is soldered to the opposite wafer surface coaxial with plate 25. The plates may for example be made of an inert metal such as silver, or of an alloy such as 99 lead–1 arsenic which will not disturb the N-type characteristics of the surface layer 14. A 99 lead–1 arsenic solder may be used to make the connection.

Figure 2B:
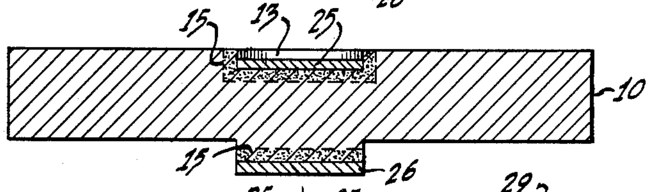

Referring to FIGURE 2B, the wafer 10 is then treated in an acid etchant for a sufficient time to remove the N-type wafer layer 14 from the exposed portions of the wafer. This makes the wafer 10 thinner, and leaves plate 26 resting on top of a raised pedestal or boss coaxially opposite the well or recess 13. The portions of the wafer beneath plates 25 and 26 are not reached by the etchant and hence remain N-type. The unit is then washed in deionized water to remove all traces of the acid.

Figure 2C:
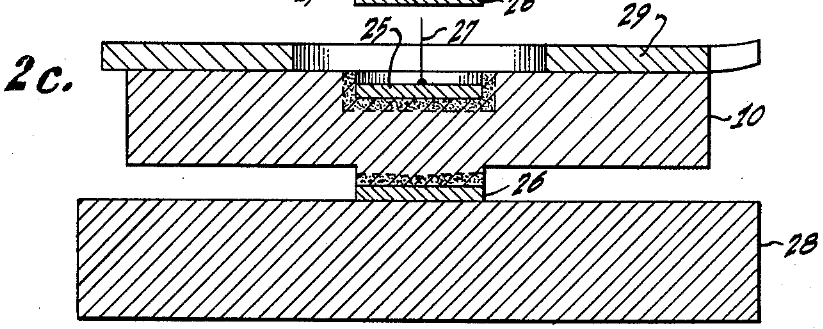

Referring to FIGURE 2C, an emitter lead 27 is soldered to plate 25. Plate 26 serves as the collector, and may be soldered directly to a heat sink 28 at the bottom of an encapsulating can. The heat sink 28 may for example be a block of oxygen-free high-conductivity copper. A ring-shaped base tab 29 is soldered to the wafer around the well 13. The device may then be mounted and encapsulated by conventional methods.

Another embodiment of the invention will now be described.

*Example III*

Figure 3A:
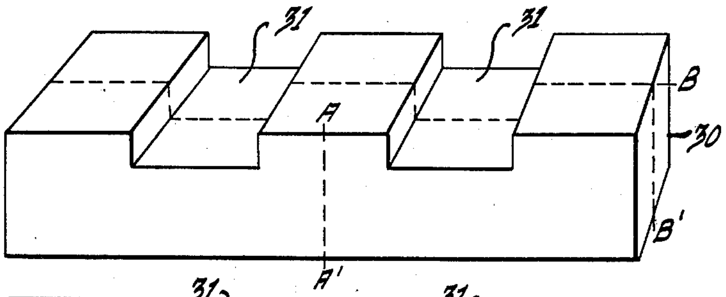

Referring to FIGURE 3A, a relatively large block 30 of P-conductivity type germanium is prepared. Uniform parallel grooves 31 are cut in one major surface of the block 30. The grooves 31 may be formed by masking those portions of the wafer surface, spraying the remainder of the wafer surface with wax, and treating the block 30 with an acid etchant as described above. Alternatively, a series of such grooves with regular rectangular cross-sections may be formed more rapidly by diamond grinding wheels. The block 30 may be about 8 mils thick, and the grinding wheels may be adjusted so that the grooves formed are about 4.8 mils deep.

Figure 3B:
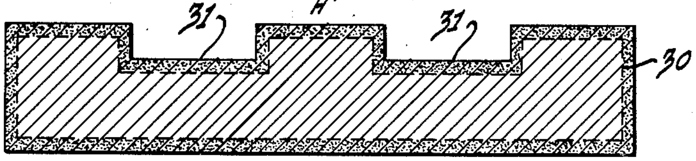

Referring to FIGURE 3B, the entire block 30 is diffused with a donor such as arsenic to produce a strongly N-type layer 32. A PN junction 33 is formed at the boundary between the N-type layer 32 and the P-type bulk of the block 30.

Figure 3C:
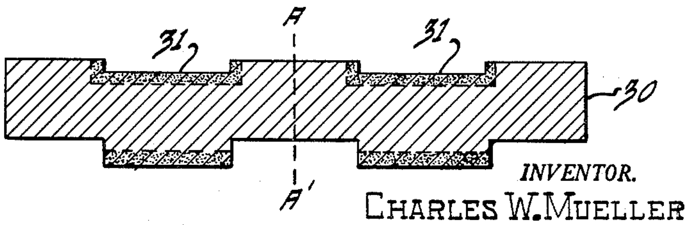

Referring to FIGURE 3C, selected portions of the surface of the block 30 may be masked, the remaining surface covered with wax, and the unit again treated in an acid etchant so as to remove the N-type layer 32 except for the portions immediately beneath each recess 31 and a coaxial portion on the opposite surface of the block. Alternatively, the same configuration may be attained more rapidly by means of diamond grinding wheels. The block 30 is then diced by cutting it along the plane AA′ and the perpendicular plane BB′ shown in FIGURE 3A. It will be appreciated that each unit will thus have a center cross-section as shown in FIGURE 1F. Each unit may then be completed as discussed above in connection with FIGURE 1G.

A junction transistor prepared in accordance with this invention exhibits the following advantages. The voltage drop from emitter to collector is reduced. A voltage drop as low as .18 volt has been obtained with a 5 ampere current. The forward current transfer ratio is quite high at high currents. A collector current to base current ratio of 100 at 10 amperes has been obtained. The switching time of the units is very good, even at high currents. A switching time of less than 1 microsecond has been observed with 5 ampere currents. The symmetrical structure of transistors according to the invention enables them to control pulses of 4 amperes in one direction and 6 amperes in the opposite direction. Thus these devices may be utilized for such applications as the deflection circuits of television receivers. Power transistors of the prior art do not have the speed of response and current capacity in both directions which is required for such applications.

As mentioned above, the invention may also be utilized to fabricate PNP devices. It will be understood that PNP units may be made in a manner similar to that described above by beginning with an N-conductivity type wafer. The wafer may consist of a semiconductor such as silicon, germanium, or silicon-germanium alloy doped with a donor such as phosphorus, arsenic or antimony. A well is formed in one wafer face as described above, and then an acceptor impurity is diffused into the wafer. The acceptor may for example be boron, aluminum, gallium or indium. The process is then continued as described above.

There have thus been described improved semiconductor devices, and improved methods of making such devices.

What is claimed is:

1. A transistor comprising a given conductivity type monocrystalline semiconductor wafer having a recess in one major wafer face, a surface layer of opposite conductivity type in said recess, a raised wafer portion on the opposite major wafer face, said raised portion being concentric with said recess and consisting of the aforesaid monocrystalline semiconductive wafer a surface layer of said opposite conductivity type on said raised portion, an emitter connection to said opposite type layer in said recess, an annular base connection to said one major wafer face around said recess, and a collector connection to said opposite type surface layer on said raised portion.

2. A transistor comprising a P-conductivity type germanium wafer, a recess in one major face of said wafer, an N-conductivity type surface layer in said recess, a raised wafer portion on the opposite major wafer face, said raised portion being concentric with said recess and consisting of the aforesaid monocrystalline semiconductive wafer, an N-conductivity type surface layer on said raised portion, an emitter connection to said N-type layer in said recess, a base connection to said one major wafer face, and a collector connection to said N-type surface layer on said raised portion.

3. A transistor comprising a P-conductivity type germanium wafer, a recess in one major wafer face, an N-conductivity type surface layer in said recess, a pedestal which is an integral part of said wafer and consists of the aforesaid P-conductivity type germanium on the other major wafer face coaxially opposite said recess, an N-conductivity type surface layer on said pedestal, an emitter connection to said N-type surface layer in said recess, a base connection to said one major wafer face, and a collector connection to said N-type surface layer on said pedestal.

4. A transistor comprising a P-conductivity type germanium wafer, a well in the center of one major wafer face, an N-conductivity type surface layer in said well, a boss which is an integral part of said wafer and consists of the aforesaid P-conductivity type germanium on the other major wafer face coaxially opposite said well, an N-conductivity type surface layer on said boss, an emitter connection to said N-type surface layer in said well, an annular base connection to said one major wafer face around said well, and a collector connection to said N-type surface layer on said boss.

5. A transistor comprising a P-conductivity type germanium wafer, a well in the center of one major wafer face, an N-conductivity type surface layer in said well, a metal plate over the bottom of said well, a boss which is an integral part of said wafer and consists of the aforesaid P-conductivity type germanium only the other major wafer face coaxially opposite said well and having a diameter substantially equal to that of said well, an N-conductivity type surface layer on said boss, a metal plate over the top of said boss, an emitter connection to said metal plate in said well, an annular base connection to said one major wafer face around said well, and a collector connection to said metal plate on said boss.

References Cited in the file of this patent

UNITED STATES PATENTS

| | | |
|---|---|---|
| 2,820,154 | Kurshan | Jan. 14, 1958 |
| 2,829,992 | Gudmundsen et al. | Apr. 8, 1958 |
| 2,847,583 | Lin | Aug. 12, 1958 |
| 2,947,925 | Maynard et al. | Aug. 2, 1960 |
| 3,039,028 | Ross | June 12, 1962 |
| 3,042,565 | Lehovec | July 3, 1962 |
| 3,087,099 | Lehovec | Apr. 23, 1963 |